(12) United States Patent
Baek et al.

(10) Patent No.: US 11,917,878 B2
(45) Date of Patent: Feb. 27, 2024

(54) DISPLAY DEVICE INCLUDING TRANSISTOR WITH VIAS CONTACTING ACTIVE LAYER THROUGH ETCH STOP LAYER, AND METHOD OF MANUFACTURING SAME

(71) Applicant: SAMSUNG DISPLAY CO., LTD., Yongin-si (KR)

(72) Inventors: Youngseok Baek, Hwaseong-si (KR); Sangjin Park, Yongin-si (KR); Chongsup Chang, Hwaseong-si (KR); Eui Kang Heo, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/193,418

(22) Filed: Mar. 30, 2023

(65) Prior Publication Data

US 2023/0240106 A1  Jul. 27, 2023

Related U.S. Application Data

(62) Division of application No. 17/307,881, filed on May 4, 2021, now Pat. No. 11,626,471.

(30) Foreign Application Priority Data

Sep. 14, 2020 (KR) .................. 10-2020-0117914

(51) Int. Cl.
*H10K 59/131* (2023.01)
*H10K 50/86* (2023.01)
*H10K 71/00* (2023.01)

(52) U.S. Cl.
CPC ......... *H10K 59/131* (2023.02); *H10K 50/865* (2023.02); *H10K 71/00* (2023.02)

(58) Field of Classification Search
CPC ............ H01L 27/3276; H01L 27/3258; H01L 27/3248; H01L 51/5284; H01L 51/56;
(Continued)

(56) References Cited

U.S. PATENT DOCUMENTS

| 2014/0131677 | A1* | 5/2014 | Oh ...................... H10K 59/1213 438/23 |
| 2017/0092707 | A1* | 3/2017 | Wang ................... H10K 59/123 |
| 2019/0027612 | A1 | 1/2019 | Zhang et al. |

FOREIGN PATENT DOCUMENTS

| KR | 10-2008-0074729 A | 8/2008 |
| KR | 10-2009-0004500 A | 1/2009 |

(Continued)

*Primary Examiner* — Matthew E. Gordon
(74) *Attorney, Agent, or Firm* — Lewis Roca Rothgerber Christie LLP

(57) ABSTRACT

A display device includes: a first active pattern on a light blocking pattern; a second active pattern at a same layer as that of the first active pattern; a first insulating pattern on the first active pattern; a second insulating pattern on the first active pattern, the second insulating pattern being spaced from the first insulating pattern, and having a first contact hole exposing the first active pattern; a first gate electrode on the first insulating pattern; a second gate electrode at a same layer as that of the first gate electrode, and overlapping with the second active pattern; a first etch stopper on the second insulating pattern, and having a second contact hole connected to the first contact hole; and a first electrode on the first etch stopper, the first electrode contacting the light blocking pattern and the first active pattern through the first and second contact holes.

8 Claims, 15 Drawing Sheets

(58) Field of Classification Search
CPC ............ H01L 2227/323; H10K 50/865; H10K 59/123; H10K 59/126; H10K 59/131; H10K 71/00; H10K 71/40; H10K 71/421; H10K 71/441
USPC .......................................................... 257/40
See application file for complete search history.

(56) References Cited

FOREIGN PATENT DOCUMENTS

| KR | 10-1108175 | B1 |   | 1/2012 |   |   |
|----|-----------|----|---|--------|---|---|
| KR | 10-1255834 | B1 |   | 4/2013 |   |   |
| KR | 10-2017-0079638 | A |   | 7/2017 |   |   |
| KR | 20170079638 | A | * | 7/2017 | ......... | H01L 27/3225 |
| KR | 10-2023924 | B1 |   | 9/2019 |   |   |

\* cited by examiner

DISPLAY DEVICE INCLUDING TRANSISTOR WITH VIAS CONTACTING ACTIVE LAYER THROUGH ETCH STOP LAYER, AND METHOD OF MANUFACTURING SAME

CROSS-REFERENCE TO RELATED APPLICATIONS

This application is a divisional of U.S. patent application Ser. No. 17/307,881, filed May 4, 2021, which claims priority to and the benefit of Korean Patent Application No. 10-2020-0117914, filed Sep. 14, 2020, the entire content of both of which is incorporated herein by reference.

BACKGROUND

1. Field

Aspects of one or more embodiments of the present disclosure relate generally to a display device, and a method of manufacturing the display device.

2. Description of the Related Art

A display device includes at least one pixel. The pixel includes a plurality of metal patterns, and connection patterns connecting the metal patterns to one another. In order to reduce a planar area of the pixel, the metal patterns may be disposed at different layers from one another. The connection patterns may electrically connect the metal patterns to one another through a contact hole exposing the metal patterns.

Because etching processes for forming the contact holes may be concurrently or simultaneously performed, a method of manufacturing the display device may be simplified. However, because the metal patterns may be disposed at different layers from one another, the metal patterns that are disposed at a relatively higher layer may be lost while the etching processes are performed.

The above information disclosed in this Background section is for enhancement of understanding of the background of the present disclosure, and therefore, it may contain information that does not constitute prior art.

SUMMARY

One or more embodiments of the present disclosure are directed to a display device.

One or more embodiments of the present disclosure are directed to a method of manufacturing the display device.

According to one or more embodiments, a display device includes: a light blocking pattern on a substrate; a first active pattern on the light blocking pattern; a second active pattern at a same layer as that of the first active pattern; a first insulating pattern on the first active pattern; a second insulating pattern on the first active pattern, the second insulating pattern being spaced from the first insulating pattern, and having a first contact hole exposing the first active pattern; a first gate electrode on the first insulating pattern; a second gate electrode at a same layer as that of the first gate electrode, and overlapping with the second active pattern; a first etch stopper on the second insulating pattern, and having a second contact hole connected to the first contact hole; a first electrode on the first etch stopper, the first electrode contacting the light blocking pattern and the first active pattern through the first contact hole and the second contact hole; a first transistor including the first active pattern and the first gate electrode; and a second transistor configured to provide a data voltage to the first transistor in response to a gate signal, and including the second active pattern and the second gate electrode.

According to an embodiment, the first etch stopper may be at the same layer as that of the first gate electrode.

According to an embodiment, the second insulating pattern may be at a same layer as that of the first insulating pattern.

According to an embodiment, the first etch stopper may contact the second insulating pattern.

According to an embodiment, the second insulating pattern may contact the first active pattern.

According to an embodiment, the display device may further include: a third insulating pattern on the first active pattern, the third insulating pattern being spaced from the first and second insulating patterns, and having a third contact hole exposing the first active pattern; a second etch stopper on the third insulating pattern, and having a fourth contact hole connected to the third contact hole; and a first connection pattern on the second etch stopper, and contacting the first active pattern through the third contact hole and the fourth contact hole.

According to an embodiment, the third insulating pattern may be at a same layer as that of the first and second insulating patterns, and the second etch stopper may be at a same layer as that of the first etch stopper.

According to an embodiment, the first connection pattern may be at a same layer as that of the first electrode.

According to an embodiment, the first connection pattern may be configured to provide a first power voltage to the first active pattern.

According to an embodiment, the display device may further include: a fourth insulating pattern between the second active pattern and the second gate electrode; a fifth insulating pattern on the second active pattern, the fifth insulating pattern being spaced from the fourth insulating pattern, and having a fifth contact hole exposing the second active pattern; a third etch stopper on the fifth insulating pattern, and having a sixth contact hole connected to the fifth contact hole; and a second connection pattern on the third etch stopper, and contacting the second active pattern through the fifth contact hole and the sixth contact hole.

According to an embodiment, the fourth insulating pattern and the fifth insulating pattern may be at a same layer as that of the first and second insulating patterns, and the third etch stopper may be at a same layer as that of the first etch stopper.

According to an embodiment, the second connection pattern may be at a same layer as that of the first electrode.

According to an embodiment, the second connection pattern may further contact the first gate electrode.

According to an embodiment, the display device may further include: a sixth insulating pattern on the second active pattern, the sixth insulating pattern being spaced from the fourth and fifth insulating patterns, and having a seventh contact hole exposing the second active pattern; a fourth etch stopper on the sixth insulating pattern, and having a eighth contact hole connected to the seventh contact hole; and a third connection pattern on the fourth etch stopper, and contacting the second active pattern through the seventh contact hole and the eighth contact hole.

According to an embodiment, the display device may further include: a data line at a layer below the second active pattern, and contacting the third connection pattern.

According to an embodiment, the data line, the third connection pattern, the second active pattern, the second connection pattern, and the first gate electrode may be electrically connected to one another.

According to an embodiment, the second insulating pattern may include an inorganic material, and the first etch stopper may include a metal.

According to an embodiment, the first active pattern may include an oxide semiconductor.

According to an embodiment, the display device may further include: an emission layer on the first electrode; and a second electrode on the emission layer.

According to one or more embodiments of the present disclosure, a method of manufacturing a display device, includes: forming a light blocking pattern on a substrate; forming an active pattern on the light blocking pattern; forming a preliminary gate insulating layer covering the active pattern on the substrate; forming a preliminary gate metal layer on the preliminary gate insulating layer; patterning the preliminary gate metal layer to concurrently form a gate electrode and an etch stopper; patterning the preliminary gate insulating layer to concurrently form a first insulating pattern and a second insulating pattern; forming an insulating layer covering the gate electrode and the etch stopper on the substrate; forming a first contact hole penetrating the insulating layer, and exposing the etch stopper; forming a second contact hole penetrating the etch stopper, and being connected to the first contact hole; forming a third contact hole and a fourth contact hole concurrently, the third contact hole exposing the active pattern and being connected to the second contact hole, and the fourth contact hole exposing the gate electrode; and forming a first electrode on the insulating layer, the first electrode contacting the active pattern through the first contact hole, the second contact hole, and the third contact hole.

According to an embodiment, the forming of the first contact hole may include forming a fifth contact hole overlapping with the light blocking pattern, and the fifth contact hole may not expose the light blocking pattern.

According to an embodiment, the forming of the third contact hole and the fourth contact hole may include forming a sixth contact hole connected to the fifth contact hole, and the sixth contact hole may expose the light blocking pattern.

According to an embodiment, the first electrode may further contact the light blocking pattern through the fifth and sixth contact holes.

According to an embodiment, the insulating layer may cover the gate electrode while the second contact hole is formed.

According to an embodiment, the first insulating pattern may overlap with the gate electrode, and the second insulating pattern may overlap with the etch stopper.

According to an embodiment, the second insulating pattern may include an insulating material, and the etch stopper may include a metal.

According to an embodiment, the method may further include: forming an emission layer on the first electrode; and forming a second electrode on the emission layer after the first electrode is formed.

According to one or more embodiments of the present disclosure, the display device may include a conductive pattern (e.g., a light blocking pattern, a data line, and/or the like), an active pattern disposed on the conductive pattern, an insulating pattern disposed on the active pattern, and an etch stopper disposed on the insulating pattern. While the insulating layer that covers the conductive pattern is etched, the etch stopper may not be etched. Accordingly, while the contact holes that expose the conductive pattern and the active pattern are concurrently (e.g., simultaneously) formed, the active pattern may not be lost.

According to one or more embodiments of the present disclosure, in the method of manufacturing the display device, an additional connection pattern (e.g., a source electrode and/or a drain electrode) may not be formed between an intermediate layer and a via insulating layer. Accordingly, a mask for forming the additional connection pattern may not be used (e.g., may not be needed or may be omitted).

However, the present disclosure is not limited to the above aspects and features, and other aspects and features of the present disclosure may be described in the description that follows, or may be realized by practicing one or more of the presented embodiments of the present disclosure.

BRIEF DESCRIPTION OF THE DRAWINGS

The above and other aspects and features of the present disclosure will become more apparent to those skilled in the art from the following detailed description of the example embodiments with reference to the accompanying drawings.

DETAILED DESCRIPTION

Figure 1:
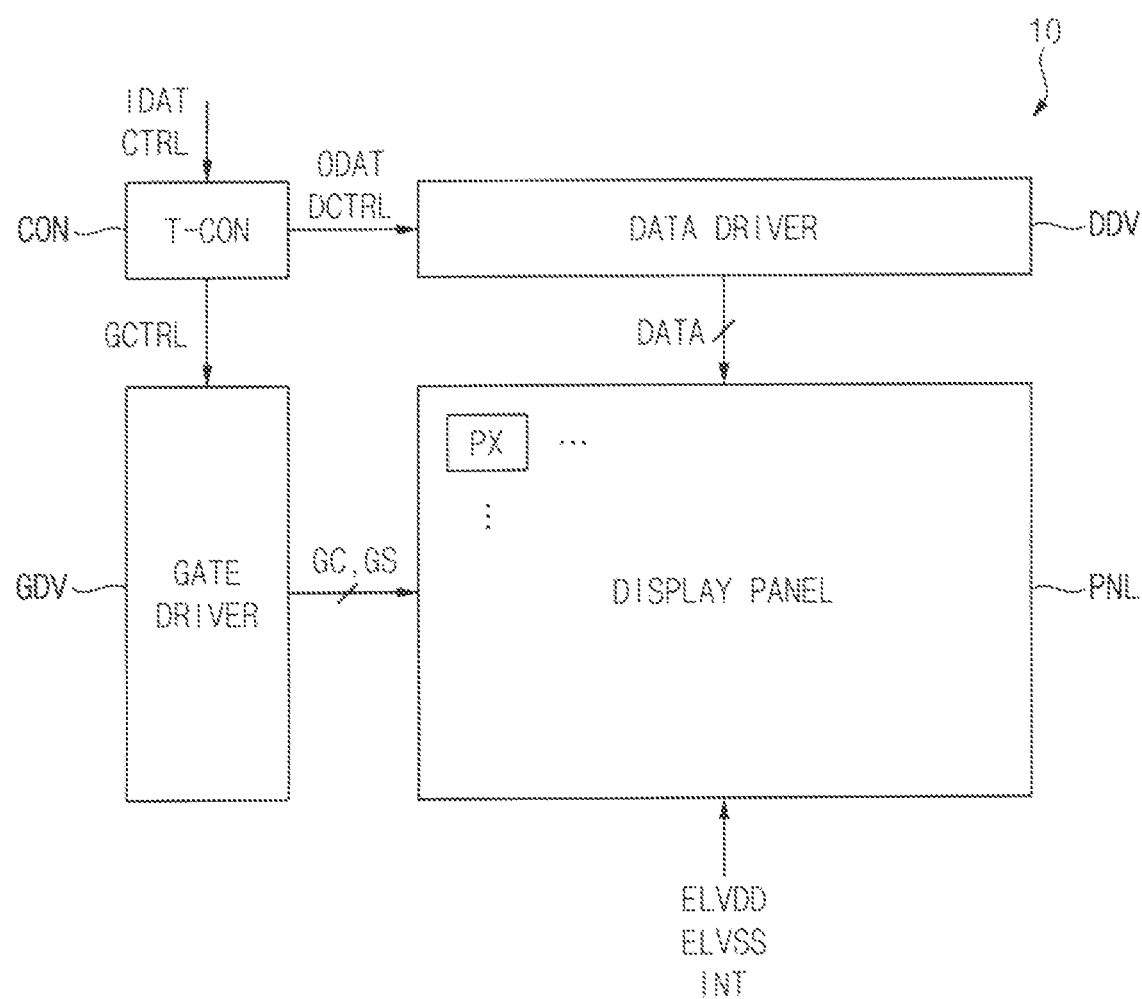
FIG. 1 is a block diagram illustrating a display device according to an embodiment.

Hereinafter, example embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a block diagram illustrating a display device according to an embodiment.

Referring to FIG. 1, a display device 10 according to an embodiment may include a display panel PNL, a data driver DDV, a gate driver GDV, and a controller CON.

The display panel PNL may include a plurality of pixels PX. Each of the pixels PX may be provided with a data voltage DATA, a first gate signal GC, a second gate signal GS, a first power voltage ELVDD, a second power voltage ELVSS, and an initialization voltage INT.

The data driver DDV may generate the data voltage DATA based on output image data ODAT and a data control signal DCTRL. For example, the data driver DDV may generate the data voltage DATA corresponding to the output image data ODAT, and may output the data voltage DATA in response to the data control signal DCTRL. The data control signal DCTRL may include an output data enable signal, a horizontal start signal, and a load signal. In an embodiment, the data driver DDV may be implemented as one or more integrated circuits (ICs), and may be electrically connected to the display panel PNL. In another embodiment, the data driver DDV may be mounted on the display panel PNL, or may be integrated into a peripheral portion of the display panel PNL.

The gate driver GDV may generate the first gate signal GC and the second gate signal GS based on a gate control signal GCTRL. For example, each of the first and second gate signals GC and GS may include a gate-on voltage for turning on a transistor, and a gate-off voltage for turning off the transistor. The gate control signal GCTRL may include a vertical start signal, a clock signal, and the like. In an embodiment, the gate driver GDV may be mounted on the display panel PNL. In another embodiment, the gate driver GDV may be implemented with one or more integrated circuits, and may be electrically connected to the display panel PNL.

The controller CON (e.g., a timing controller T-CON) may receive input image data IDAT and a control signal CTRL from an external host processor (e.g., from a graphics processing unit (GPU)). For example, the input image data IDAT may include (e.g., may be) RGB data including red image data, green image data, and blue image data. The control signal CTRL may include a vertical synchronization signal, a horizontal synchronization signal, an input data enable signal, a master clock signal, and the like. The controller CON may generate the gate control signal GCTRL, the data control signal DCTRL, and the output image data ODAT based on the input image data IDAT and the control signal CTRL.

Figure 2:
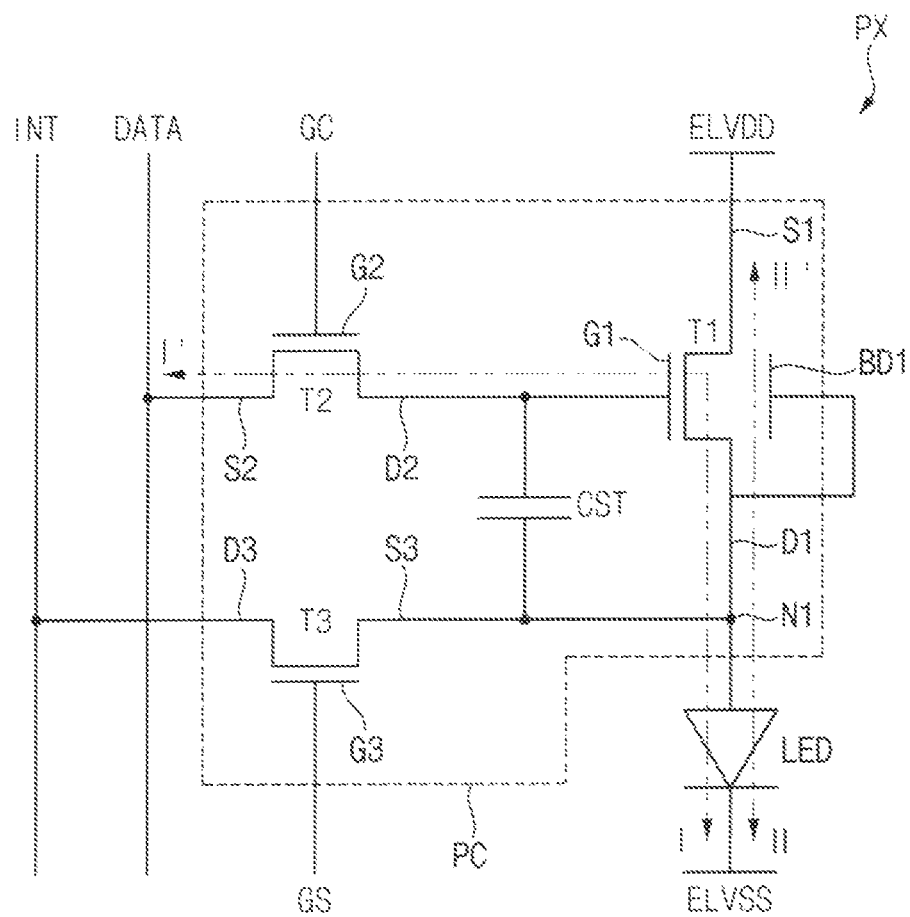
FIG. 2 is a circuit diagram illustrating an example of a pixel included in the display device of FIG. 1.

FIG. 2 is a circuit diagram illustrating an example of a pixel included in the display device of FIG. 1.

Referring to FIGS. 1 and 2, the pixel PX may include a pixel circuit PC, and at least one light emitting diode LED. The pixel circuit PC may generate a driving current, and the light emitting diode LED may emit light based on the driving current. For example, the light emitting diode LED may be implemented as an organic light emitting diode, a quantum-nano light emitting diode, or the like.

The pixel circuit PC may include a first transistor T1, a second transistor T2, a third transistor T3, and a storage capacitor CST. The pixel circuit PC may be electrically connected to the light emitting diode LED to provide the driving current to the light emitting diode LED.

The first transistor T1 may include a gate terminal G1, a first terminal S1, a second terminal D1, and a third terminal BD1. The gate terminal G1 of the first transistor T1 may be connected to a second terminal D2 of the second transistor T2. The first terminal S1 of the first transistor T1 may receive the first power voltage ELVDD. The second terminal D1 of the first transistor T1 may be connected to a first node N1. The third terminal BD1 of the first transistor T1 may be connected to the second terminal D1 of the first transistor T1. The first transistor T1 may generate the driving current based on the first power voltage ELVDD and the data voltage DATA. The driving current may be provided to the light emitting diode LED through the first node N1. For example, the first transistor T1 may be referred to as a driving transistor.

The second transistor T2 may include a gate terminal G2, a first terminal S2, and the second terminal D2. The second transistor T2 may provide the data voltage DATA to the first transistor T1 in response to the first gate signal GC. For example, the gate terminal G2 of the second transistor T2 may receive the first gate signal GC. The first terminal S2 of the second transistor T2 may receive the data voltage DATA. The second terminal D2 of the second transistor T2 may provide the data voltage DATA to the gate terminal G1 of the first transistor T1.

The second transistor T2 may be turned on or turned off in response to the first gate signal GC. For example, when the second transistor T2 is an NMOS transistor, the second transistor T2 may be turned off when the first gate signal GC has a low voltage level (e.g., a negative voltage level), and may be turned on when the first gate signal GC has a high voltage level (e.g., a positive voltage level). For example, the second transistor T2 may be referred to as a switching transistor.

The third transistor T3 may include a gate terminal G3, a first terminal S3, and a second terminal D3. The gate terminal G3 of the third transistor T3 may receive the second gate signal GS. The first terminal S3 of the third transistor T3 may be connected to the light emitting diode LED. The second terminal D3 of the third transistor T3 may receive the initialization voltage INT.

The third transistor T3 may be turned on or turned off in response to the second gate signal GS. For example, when the third transistor T3 is an NMOS transistor, the third transistor T3 may be turned on when the second gate signal GS has a high voltage level (e.g., a positive voltage level), and may be turned off when the second gate signal GS has a low voltage level (e.g., a negative voltage level).

During a period in which the third transistor T3 is turned on in response to the second gate signal GS, the initialization voltage INT may be applied to the light emitting diode LED. For example, the third transistor T3 may be referred to as an initialization transistor.

The storage capacitor CST may be electrically connected to the gate terminal G1 of the first transistor T1 and the second terminal D1 of the first transistor T1.

The light emitting diode LED may include a first terminal (e.g., an anode terminal) and a second terminal (e.g., a cathode terminal). The first terminal may be connected to the first node N1, and the second terminal may receive the second power voltage ELVSS. The light emitting diode LED may generate light having a luminance corresponding to the driving current.

A connection structure between the pixel circuit PC and the light emitting diode LED shown in FIG. 2 is provided as an example, and thus, may be variously modified as needed or desired as would be understood by those having ordinary skill in the art.

Figure 3:
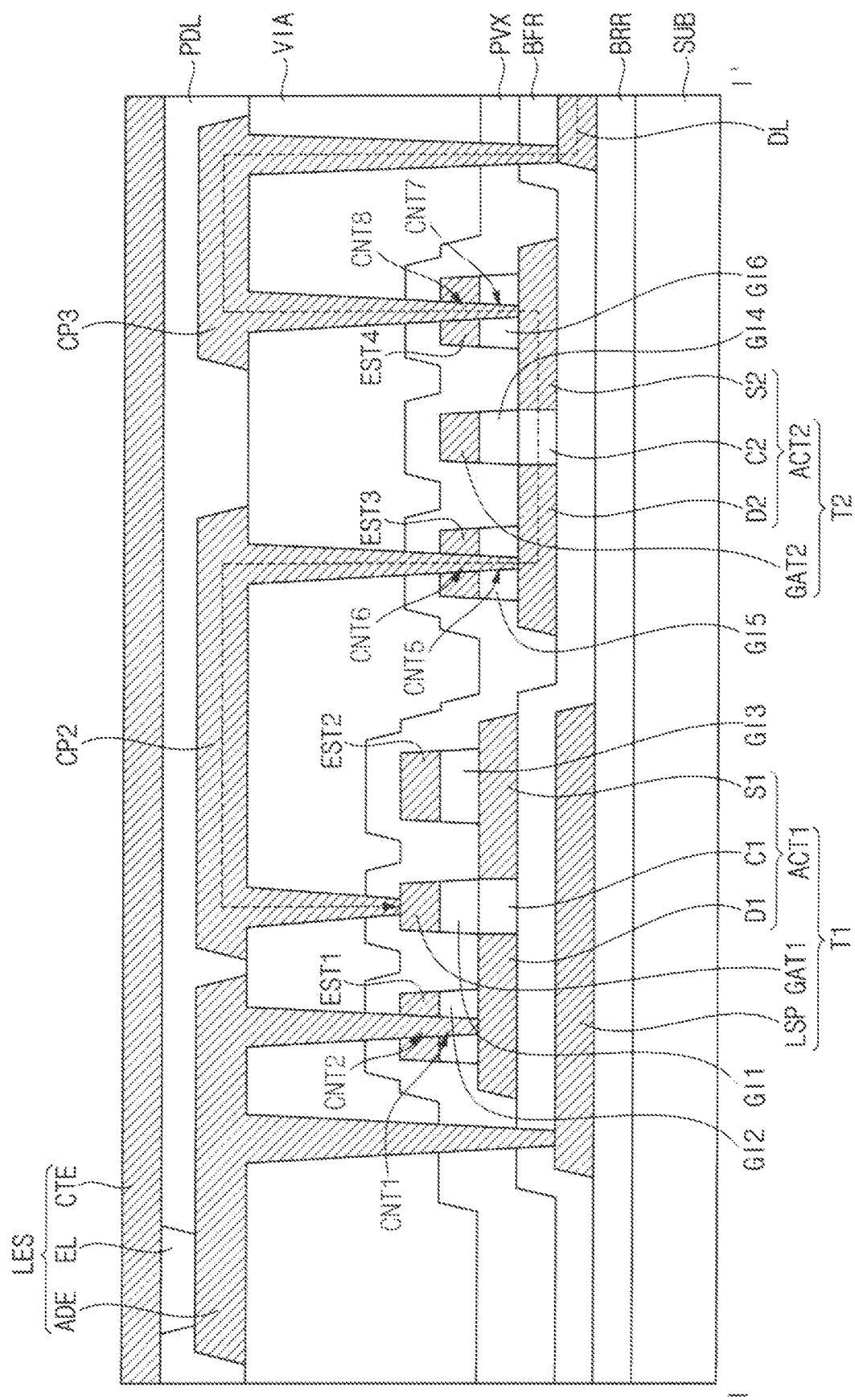
FIG. 3 is a cross-sectional view illustrating a first transistor, a second transistor, and a light emitting diode included in the pixel of FIG. 2.
Figure 4:
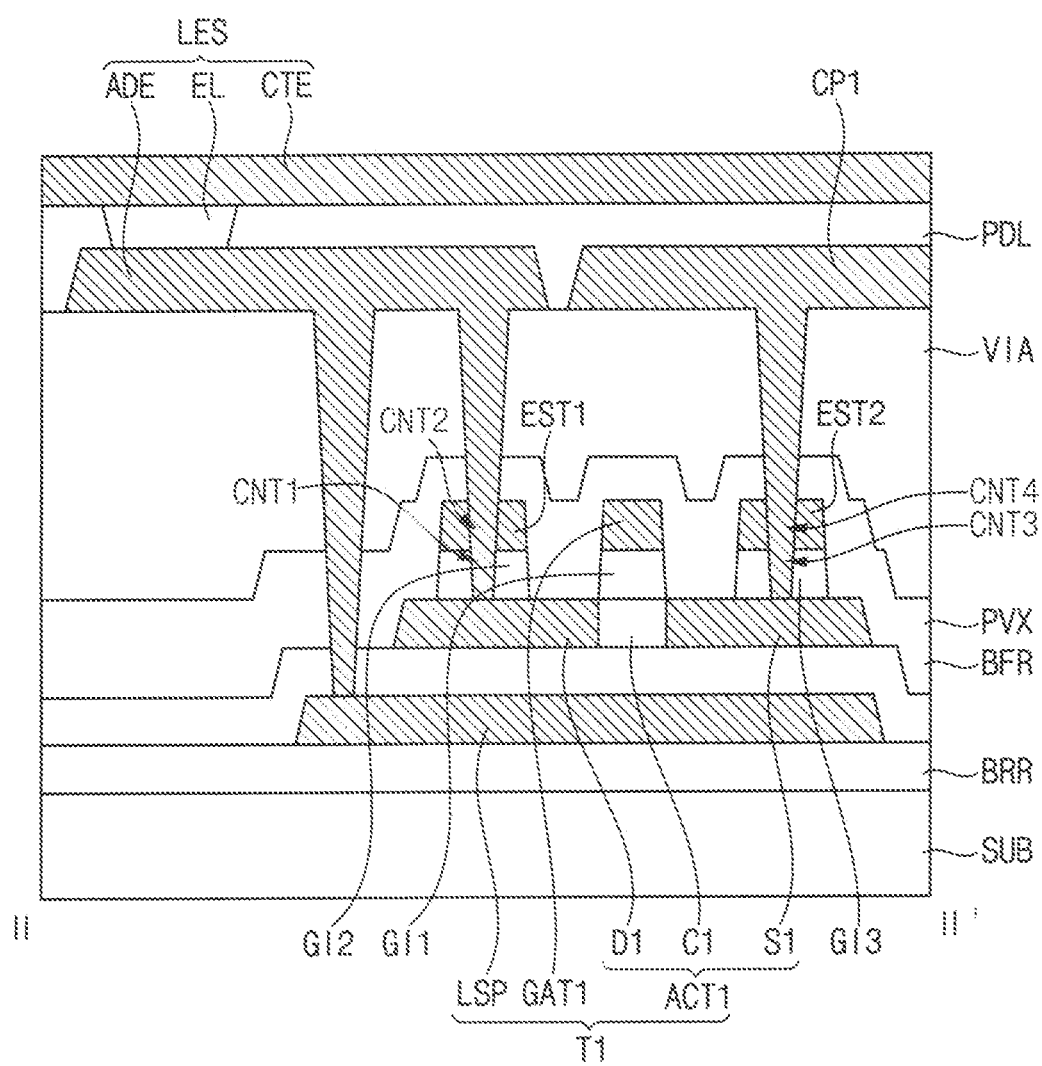
FIG. 4 is a cross-sectional view illustrating a first transistor and a light emitting diode included in the pixel of FIG. 2.

FIG. 3 is a cross-sectional view illustrating the first transistor, the second transistor, and the light emitting diode included in the pixel of FIG. 2. FIG. 4 is a cross-sectional view illustrating the first transistor and the light emitting diode included in the pixel of FIG. 2. For example, FIG. 3 may be a cross-sectional view taken along the line I-I' of FIG. 2, and FIG. 4 may be a cross-sectional view taken along the line II-II' of FIG. 2

Referring to FIGS. 1, 2, 3, and 4, the display device 10 may include a substrate SUB, a barrier layer BRR, a light blocking pattern LSP, a data line DL, a buffer layer BFR, a first active pattern ACT1, a second active pattern ACT2, a first insulating pattern GI1, a second insulating pattern GI2, a third insulating pattern GI3, a fourth insulating pattern GI4, a fifth insulating pattern GI5, a sixth insulating pattern GI6, a first gate electrode GAT1, a second gate electrode GAT2, a first etch stopper EST1, a second etch stopper EST2, a third etch stopper EST3, a fourth etch stopper EST4, an intermediate film PVX, a via insulating layer VIA, a first electrode ADE, a first connection pattern CP1, a second connection pattern CP2, a third connection pattern CP3, a pixel defining layer PDL, an emission layer EL, and a second electrode CTE. For example, the light blocking pattern LSP, the first active pattern ACT1, and the first gate electrode GAT1 may constitute (e.g., may be included in or may form) the first transistor T1. In addition, the second active pattern ACT2 and the second gate electrode GAT2 may constitute (e.g., may be included in or may form) the second transistor T2.

In an embodiment, in order to manufacture the display device 10, an additional connection pattern may not be formed between the intermediate film PVX and the via insulating layer VIA. In other words, a comparative display device may include the additional connection pattern between the intermediate film PVX and the via insulating layer VIA. On the other hand, the display device 10 according to the present embodiment may not include the additional connection pattern. Accordingly, in the manufacturing process of the display device 10, a mask for forming the additional connection pattern may not be used (e.g., may not be needed or may be omitted).

The substrate SUB may include glass, quartz, plastic, or the like. In an embodiment, the substrate SUB may include glass. Accordingly, the display device 10 may be a rigid display device. In another embodiment, the substrate SUB may include plastic. Accordingly, the display device 10 may be a flexible display device.

The barrier layer BRR may be disposed on the substrate SUB. The barrier layer BRR may include an inorganic material. For example, the barrier layer BRR may include silicon oxide, silicon nitride, silicon oxynitride, aluminum oxide, or the like. The barrier layer BRR may prevent or substantially prevent metal atoms and/or impurities from being diffused from the substrate SUB to an upper surface of the substrate SUB.

The light blocking pattern LSP may be disposed on the barrier layer BRR. For example, the light blocking pattern LSP may include a metal, a doped oxide semiconductor, a doped silicon semiconductor, or the like. The light blocking pattern LSP may prevent or substantially prevent external light from reaching the first active pattern ACT1. Accordingly, a leakage current of the first transistor T1 may be reduced, and an electrical characteristic of the first transistor T1 may be improved.

The data line DL may be disposed on the barrier layer BRR. In an embodiment, the data line DL may be disposed in the same layer as the light blocking pattern LSP.

The data line DL may include a conductive material. For example, the data line DL may include a metal, a doped oxide semiconductor, a doped silicon semiconductor, or the like. The data line DL may provide the data voltage DATA to the second transistor T2 through the third connection pattern CP3.

The buffer layer BFR may be disposed on the barrier layer BRR. The buffer layer BFR may cover the light blocking pattern LSP and the data line DL. The buffer layer BFR may include an inorganic material. For example, the buffer layer BFR may include silicon oxide, silicon nitride, silicon oxynitride, aluminum oxide, or the like.

The first active pattern ACT1 may be disposed on the buffer layer BFR. For example, the first active pattern ACT1 may overlap with the light blocking pattern LSP.

In an embodiment, the first active pattern ACT1 may include an oxide semiconductor. For example, the first active pattern ACT1 may include zinc ("Zn"), indium ("In"), gallium ("Ga"), tin ("Sn"), aluminum ("Al"), zinc oxide ("ZnO"), indium oxide ("InO"), indium gallium zinc oxide ("In—Ga—Zn—O"), zinc tin oxide ("Zn—Sn—O"), and/or the like. In addition, the first active pattern ACT1 may include a source region S1, a drain region D1, and a channel region C1 disposed between the source region S1 and the drain region D1. The source region S1 and the drain region D1 may be doped regions. In another embodiment, the first active pattern ACT1 may include a silicon semiconductor. For example, the first active pattern ACT1 may include amorphous silicon, polycrystalline silicon, or the like.

The second active pattern ACT2 may be disposed on the buffer layer BFR. In an embodiment, the second active pattern ACT2 may be disposed at (e.g., in or on) the same layer as that of the first active pattern ACT1. For example, the second active pattern ACT2 may be connected to the first active pattern ACT1 on a plane (e.g., in a plan view).

In an embodiment, the second active pattern ACT2 may include an oxide semiconductor. For example, the second active pattern ACT2 may include zinc ("Zn"), indium ("In"), gallium ("Ga"), tin ("Sn"), aluminum ("Al"), zinc oxide ("ZnO"), indium oxide ("InO"), indium gallium zinc oxide ("In—Ga—Zn—O"), zinc tin oxide ("Zn—Sn—O"), and/or the like. In addition, the second active pattern ACT2 may include a source region S2, a drain region D2, and a channel region C2 disposed between the source region S2 and the drain region D2. The source region S2 and the drain region D2 may be doped regions. In another embodiment, the second active pattern ACT2 may include a silicon semiconductor. For example, the second active pattern ACT2 may include amorphous silicon, polycrystalline silicon, or the like.

The first insulating pattern GI1 may be disposed on the channel region C1 of the first active pattern ACT1. The first insulating pattern GI1 may include an inorganic material. For example, the first insulating pattern GI1 may include silicon oxide, silicon nitride, silicon oxynitride, aluminum oxide, or the like. The first insulating pattern GI1 may electrically insulate the first active pattern ACT1 and the gate electrode GAT1 from each other.

The second insulating pattern GI2 may be disposed on the drain region D1 of the first active pattern ACT1. The second insulating pattern GI2 may include an inorganic material. For example, the second insulating pattern GI2 may include silicon oxide, silicon nitride, silicon oxynitride, aluminum oxide, or the like.

In an embodiment, a first contact hole CNT1 may be formed in the second insulating pattern GI2. The first contact hole CNT1 may penetrate the second insulating pattern GI2, and may expose the first active pattern ACT1.

The third insulating pattern GI3 may be disposed on the source region S1 of the first active pattern ACT1. The third insulating pattern GI3 may include an inorganic material. For example, the third insulating pattern GI3 may include silicon oxide, silicon nitride, silicon oxynitride, aluminum oxide, or the like.

In an embodiment, a third contact hole CNT3 may be formed in the third insulating pattern GI3. The third contact hole CNT3 may penetrate the third insulating pattern GI3, and may expose the first active pattern ACT1.

In an embodiment, the first to third insulating patterns GI1, GI2, and GI3 may contact the first active pattern ACT1.

The fourth insulating pattern GI4 may be disposed on the channel region C2 of the second active pattern ACT2. The fourth insulating pattern GI4 may include an inorganic material. For example, the fourth insulating pattern GI4 may include silicon oxide, silicon nitride, silicon oxynitride, aluminum oxide, or the like. The fourth insulating pattern GI4 may electrically insulate the second active pattern ACT1 and the second gate electrode GAT2 from each other.

The fifth insulating pattern GI5 may be disposed on the drain region D2 of the second active pattern ACT2. The fifth insulating pattern GI5 may include an inorganic material. For example, the fifth insulating pattern GI5 may include silicon oxide, silicon nitride, silicon oxynitride, aluminum oxide, or the like.

In an embodiment, a fifth contact hole CNT5 may be formed in the fifth insulating pattern GI5. The fifth contact hole CNT5 may penetrate the fifth insulating pattern GI5, and may expose the second active pattern ACT2.

The sixth insulating pattern GI6 may be disposed on the source region S2 of the second active pattern ACT2. The sixth insulating pattern GI6 may include an inorganic material. For example, the sixth insulating pattern GI6 may include silicon oxide, silicon nitride, silicon oxynitride, aluminum oxide, or the like.

In an embodiment, a seventh contact hole CNT7 may be formed in the sixth insulating pattern GI6. The seventh contact hole CNT7 may penetrate the sixth insulating pattern GI6, and may expose the second active pattern ACT2.

In an embodiment, the fourth to sixth insulating patterns GI4, GI5, and GI6 may contact the second active pattern ACT2.

In an embodiment, the first to sixth insulating patterns GI1, GI2, GI3, GI4, GI5, and GI6 may be disposed at (e.g., in or on) the same layer as each other, and may be spaced apart from each other. For example, the first to sixth insulating patterns GI1, GI2, GI3, GI4, GI5, and GI6 may include the same material as each other, and may be formed together.

The first gate electrode GAT1 may be disposed on the first insulating pattern GI1. In an embodiment, the first gate electrode GAT1 may overlap with the channel region C1 of the first active pattern ACT1 and the first insulating pattern GI1. For example, the first gate electrode GAT1 may correspond to the gate terminal G1 of the first transistor T1 described above with reference to FIG. 2.

The first gate electrode GAT1 may include a conductive material. For example, the first gate electrode GAT1 may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and/or the like. For example, the gate electrode GAT1 may include copper ("Cu").

In an embodiment, the light blocking pattern LSP, the first active pattern ACT1, and the first gate electrode GAT1 may constitute (e.g., may be included in or may form) the first transistor T1.

The first etch stopper EST1 may be disposed on the second insulating pattern GI2, and may contact the second insulating pattern GI2. In an embodiment, the first etch stopper EST1 may overlap with the drain region D1 of the first active pattern ACT1 and the second insulating pattern GI2. The first etch stopper EST1 may include a conductive material. For example, the first etch stopper EST1 may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and/or the like.

In an embodiment, a second contact hole CNT2 may be formed in the first etch stopper EST1. The second contact hole CNT2 may penetrate the first etch stopper EST1, and may be connected to the first contact hole CNT1.

The second etch stopper EST2 may be disposed on the third insulating pattern GI3, and may contact the third insulating pattern GI3. In an embodiment, the second etch stopper EST2 may overlap with the source region S1 of the first active pattern ACT1 and the third insulating pattern GI3. The second etch stopper EST2 may include a conductive material. For example, the second etch stopper EST2 may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and/or the like.

In an embodiment, a fourth contact hole CNT4 may be formed in the second etch stopper EST2. The fourth contact hole CNT4 may penetrate the second etch stopper EST2, and may be connected to the third contact hole CNT3.

The second gate electrode GAT2 may be disposed on the fourth insulating pattern GI4, and may contact the fourth insulating pattern GI4. In an embodiment, the second gate electrode GAT2 may overlap with the channel region C2 of the second active pattern ACT2 and the fourth insulating pattern GI4. For example, the second gate electrode GAT2 may correspond to the gate terminal G2 of the second transistor T2 described above with reference to FIG. 2.

In an embodiment, the second gate electrode GAT2 may include a conductive material. For example, the second gate electrode GAT2 may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and/or the like.

In an embodiment, the second active pattern ACT2 and the second gate electrode GAT2 may constitute (e.g., may be included in or may form) the second transistor T2 for providing the data voltage DATA to the first transistor T1 in response to the first gate signal GC.

The third etch stopper EST3 may be disposed on the fifth insulating pattern GI5, and may contact the fifth insulating pattern GI5. In an embodiment, the third etch stopper EST3 may overlap with the drain region D2 of the second active pattern ACT2 and the fifth insulating pattern GI5. The third etch stopper EST3 may include a conductive material. For example, the third etch stopper EST3 may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and/or the like.

In an embodiment, a sixth contact hole CNT6 may be formed in the third etch stopper EST3. The sixth contact hole CNT6 may penetrate the third etch stopper EST3, and may be connected to the fifth contact hole CNT5.

The fourth etch stopper EST4 may be disposed on the sixth insulating pattern GI6, and may contact the sixth insulating pattern GI6. In an embodiment, the fourth etch stopper EST4 may overlap with the source region S2 of the second active pattern ACT2 and the sixth insulating pattern GI6. The fourth etch stopper EST4 may include a conductive material. For example, the fourth etch stopper EST4 may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and/or the like.

In an embodiment, an eighth contact hole CNT8 may be formed in the fourth etch stopper EST4. The eighth contact hole CNT8 may penetrate the fourth etch stopper EST4, and may be connected to the seventh contact hole CNT7.

In an embodiment, the first gate electrode GAT1, the second gate electrode GAT2, the first etch stopper EST1, the second etch stopper EST2, the third etch stopper EST3, and the fourth etch stoppers EST4 may be disposed at (e.g., in or on) the same layer as each other, and may be spaced apart from each other. For example, the first gate electrode GAT1, the second gate electrode GAT2, the first etch stopper EST1, the second etch stopper EST2, the third etch stopper EST3, and the fourth etch stopper EST4 may include the same material as each other, and may be formed together.

The intermediate layer PVX may be disposed on the buffer layer BFR. The intermediate layer PVX may cover the exposed first active pattern ACT1 and the exposed second active pattern ACT2. The intermediate layer PVX may include an inorganic material. For example, the intermediate layer PVX may include silicon oxide, silicon nitride, silicon oxynitride, aluminum oxide, or the like.

The via insulating layer VIA may be disposed on the intermediate layer PVX. The via insulating layer VIA may include an organic material. For example, the via insulating layer VIA may include a photoresist, a polyacrylic resin, a polyimide resin, an acrylic resin, or the like. The via insulating layer VIA may have a flat or a substantially flat top surface.

In an embodiment, the first electrode ADE, the emission layer EL, and the second electrode CTE may constitute (e.g., may be included in or may form) a light emitting structure LES.

The first electrode ADE may be disposed on the via insulating layer VIA. The first electrode ADE may include a metal, an alloy, a conductive metal oxide, a transparent conductive material, or the like. For example, the first electrode ADE may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN'), titanium ("Ti"), tantalum ("Ta'), platinum ("Pt"), scandium ("Sc"), indium tin oxide ("ITO"), indium zinc oxide ("IZO"), and/or the like. For example, the first electrode ADE may have a stacked structure of Ag/ITO/Ag.

In an embodiment, the first electrode ADE may contact the first active pattern ACT1 through the first and second contact holes CNT1 and CNT2. In addition, the first electrode ADE may contact the light blocking pattern LSP. Accordingly, the first electrode ADE may electrically connect the first active pattern ACT1 and the light blocking pattern LSP to each other.

The pixel defining layer PDL may be disposed on the via insulating layer VIA. The pixel defining layer PDL may expose an upper surface of the first electrode ADE. The pixel defining layer PDL may include an organic material. For example, the pixel defining layer PDL may include a photoresist, a polyacrylic resin, a polyimide resin, an acrylic resin, or the like.

The emission layer EL may be disposed on the first electrode ADE. For example, the emission layer EL may include an organic light emitting material, a nano light emitting material, or the like. The emission layer EL may emit light by receiving the driving current.

The second electrode CTE may be disposed on the emission layer EL. In an embodiment, the second electrode CTE may be arranged in a plate shape. The second electrode CTE may include a metal, an alloy, a conductive metal oxide, a transparent conductive material, or the like. For example, the second electrode CTE may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and/or the like.

The first connection pattern CP1 may be disposed on the via insulating layer VIA. The first connection pattern CP1 may include a metal, an alloy, a conductive metal oxide, a transparent conductive material, and/or the like. For example, the first connection pattern CP1 may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and/or the like. For example, the first connection pattern CP1 may have a stacked structure of Ag/ITO/Ag.

In an embodiment, the first connection pattern CP1 may contact the first active pattern ACT1 through the third and fourth contact holes CNT3 and CNT4. Accordingly, the first connection pattern CP1 may provide the first power voltage ELVDD to the first active pattern ACT1.

The second connection pattern CP2 may be disposed on the via insulating layer VIA. The second connection pattern CP2 may include a metal, an alloy, a conductive metal oxide, a transparent conductive material, and/or the like. For example, the second connection pattern CP2 may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and/or the like. For example, the second connection pattern CP2 may have a stacked structure of Ag/ITO/Ag.

In an embodiment, the second connection pattern CP2 may contact the second active pattern ACT2 through the fifth and sixth contact holes CNT5 and CNT6. Accordingly, the second connection pattern CP2 may provide the data voltage DATA to the first gate electrode GAT1.

The third connection pattern CP3 may be disposed on the via insulating layer VIA. The third connection pattern CP3 may include a metal, an alloy, a conductive metal oxide, a transparent conductive material, and/or the like. For example, the third connection pattern CP3 may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and/or the like. For example, the third connection pattern CP3 may have a stacked structure of Ag/ITO/Ag.

In an embodiment, the third connection pattern CP3 may contact the second active pattern ACT2 through the seventh and eighth contact holes CNT7 and CNT8. In addition, the third connection pattern CP3 may contact the data line DL. Accordingly, the third connection pattern CP3 may provide the data voltage DATA to the second active pattern ACT2.

In an embodiment, the first electrode ADE, the first connection pattern CP1, the second connection pattern CP2, and the third connection pattern CP3 may be disposed at (e.g., in or on) the same layer as each other, and may be spaced apart from each other. For example, the first electrode ADE, the first connection pattern CP1, the second connection pattern CP2, and the third connection pattern CP3 may include the same material as each other, and may be formed together.

FIGS. 5, 6, 7, 8, 9, 10, 11, 12, 13, 14, and 15 are cross-sectional views illustrating various processes of a method of manufacturing a display device according to an embodiment.

Figure 5:
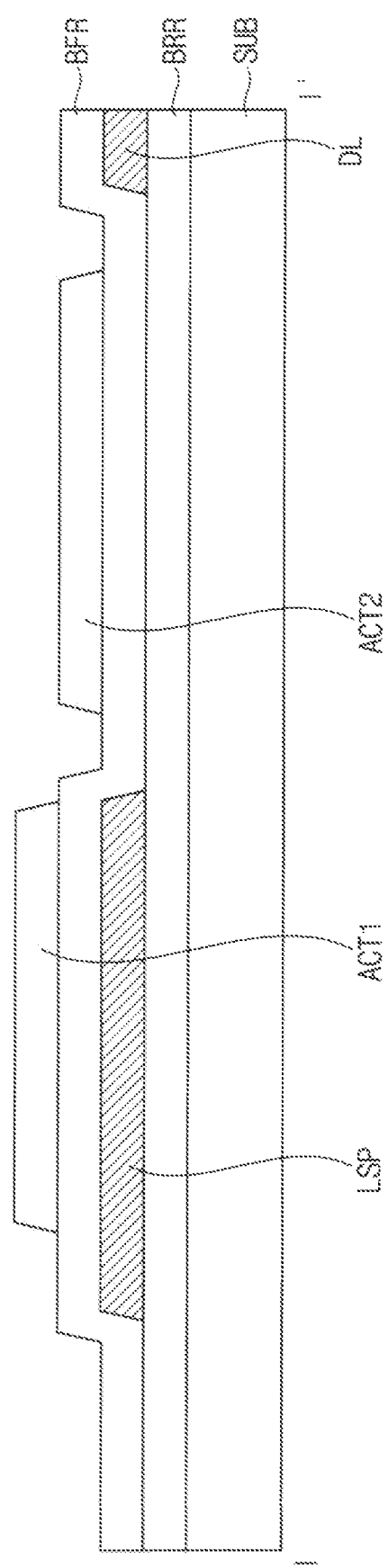
FIGS. 5-15 are cross-sectional views illustrating various processes of a method of manufacturing a display device according to an embodiment.

Referring to FIG. 5, in the method of manufacturing the display device 10 according to an embodiment, the barrier layer BRR may be formed on the substrate SUB, and the light blocking pattern LSP and the data line DL may be formed on the barrier layer BRR. The buffer layer BFR may be formed on the barrier layer BRR, and the first and second active patterns ACT1 and ACT2 may be formed on the buffer layer BFR.

Figure 6:
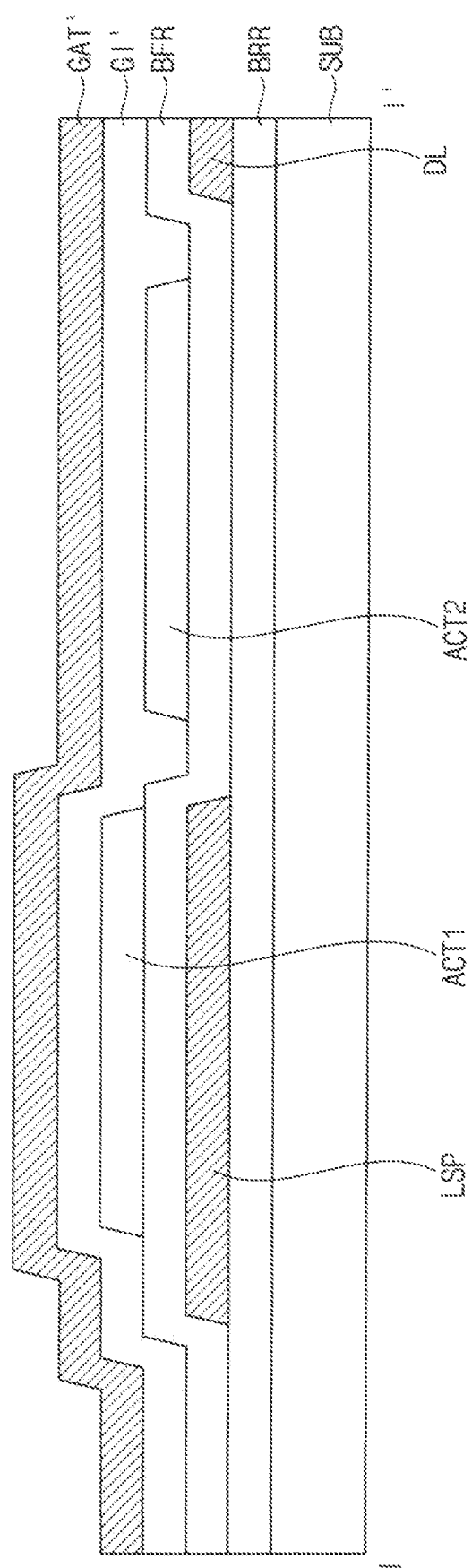

Referring to FIG. 6, a preliminary gate insulating layer GI' may be formed on the buffer layer BFR. The preliminary gate insulating layer GI' may cover the first and second active patterns ACT1 and ACT2. For example, the preliminary gate insulating layer GI' may include silicon oxide, silicon nitride, silicon oxynitride, tantalum oxide, tantalum nitride, and/or the like.

In addition, a preliminary gate metal layer GAT' may be formed on the preliminary gate insulating layer GI'. For example, the preliminary gate metal layer GAT' may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and/or the like.

Figure 7:
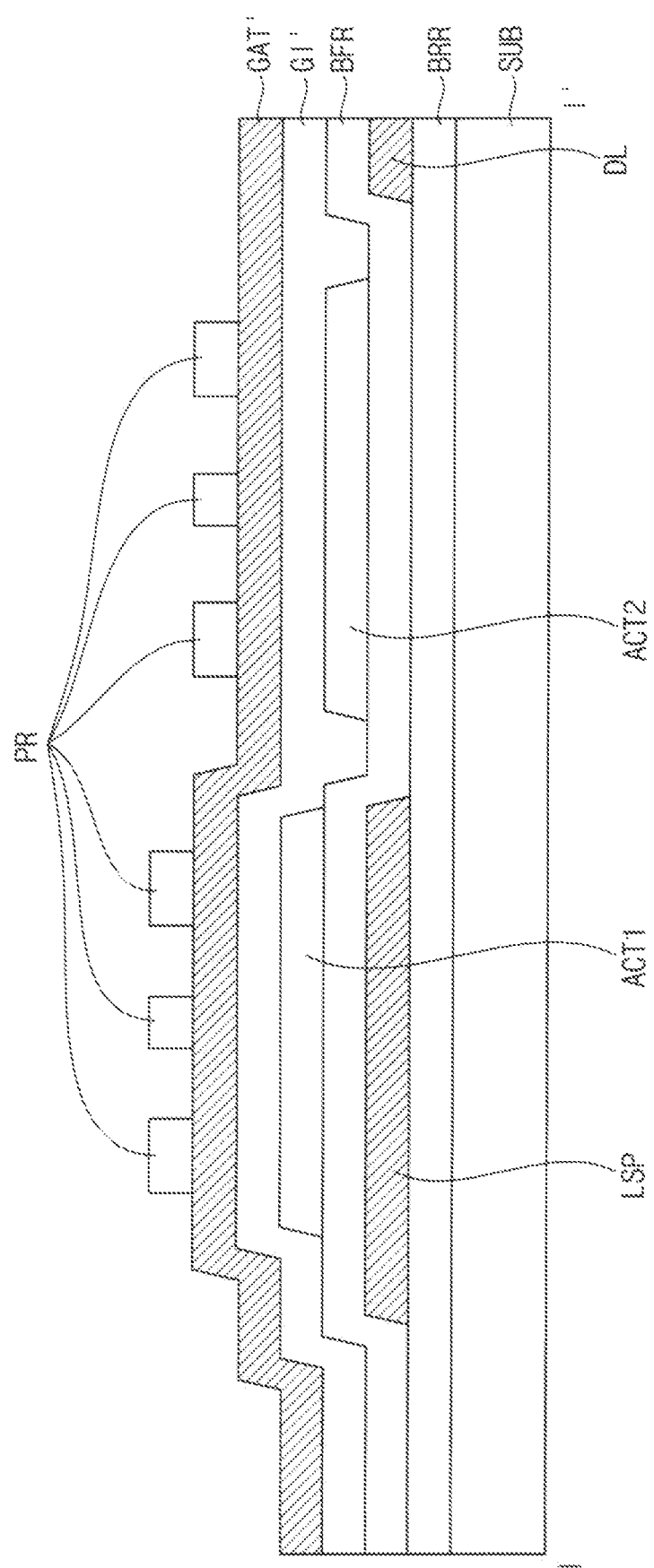
Figure 8:
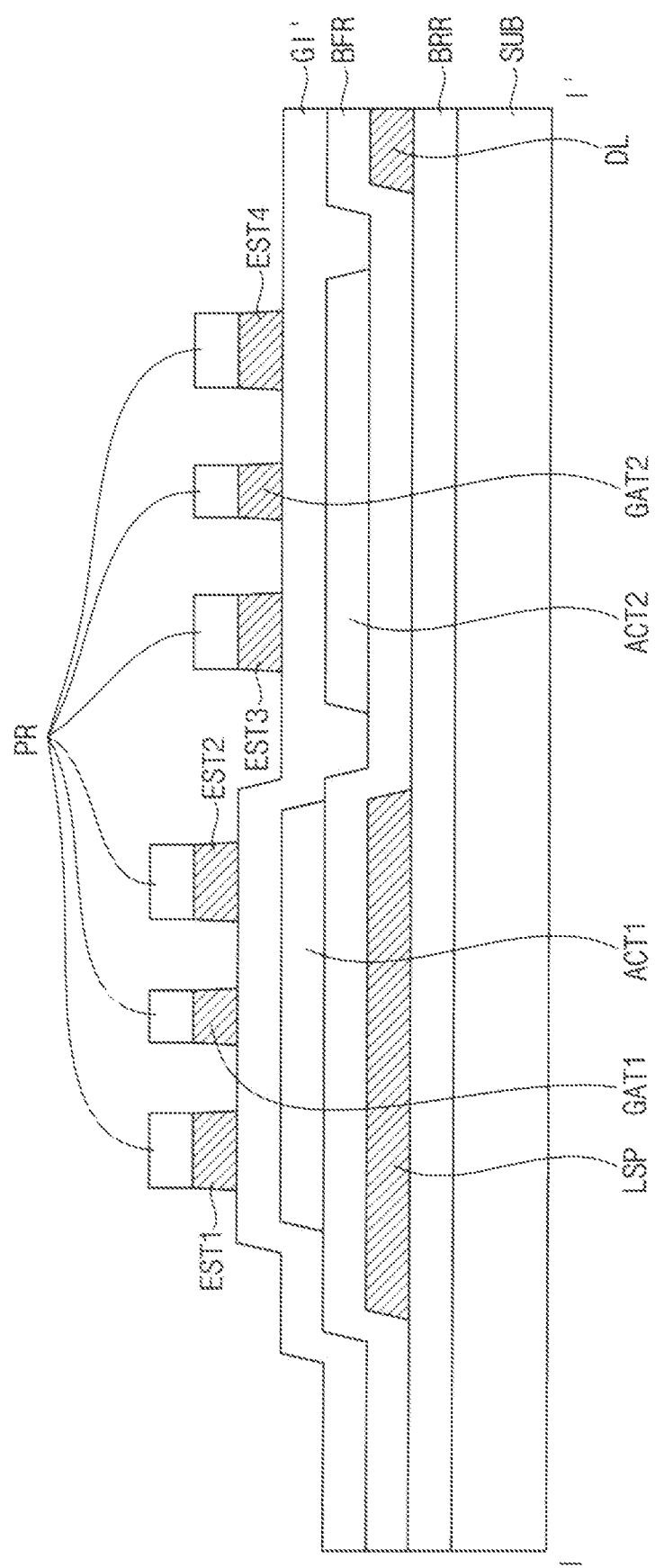

Referring to FIGS. 7 and 8, photoresist patterns PR may be formed on the preliminary gate metal layer GAT'. The preliminary gate metal layer GAT' may be patterned using the photoresist patterns PR. Accordingly, the first gate electrode GAT1, the second gate electrode GAT2, the first etch stopper EST1, the second etch stopper EST2, the third etch stopper EST3, and the fourth etch stopper EST4 may be formed.

Figure 9:
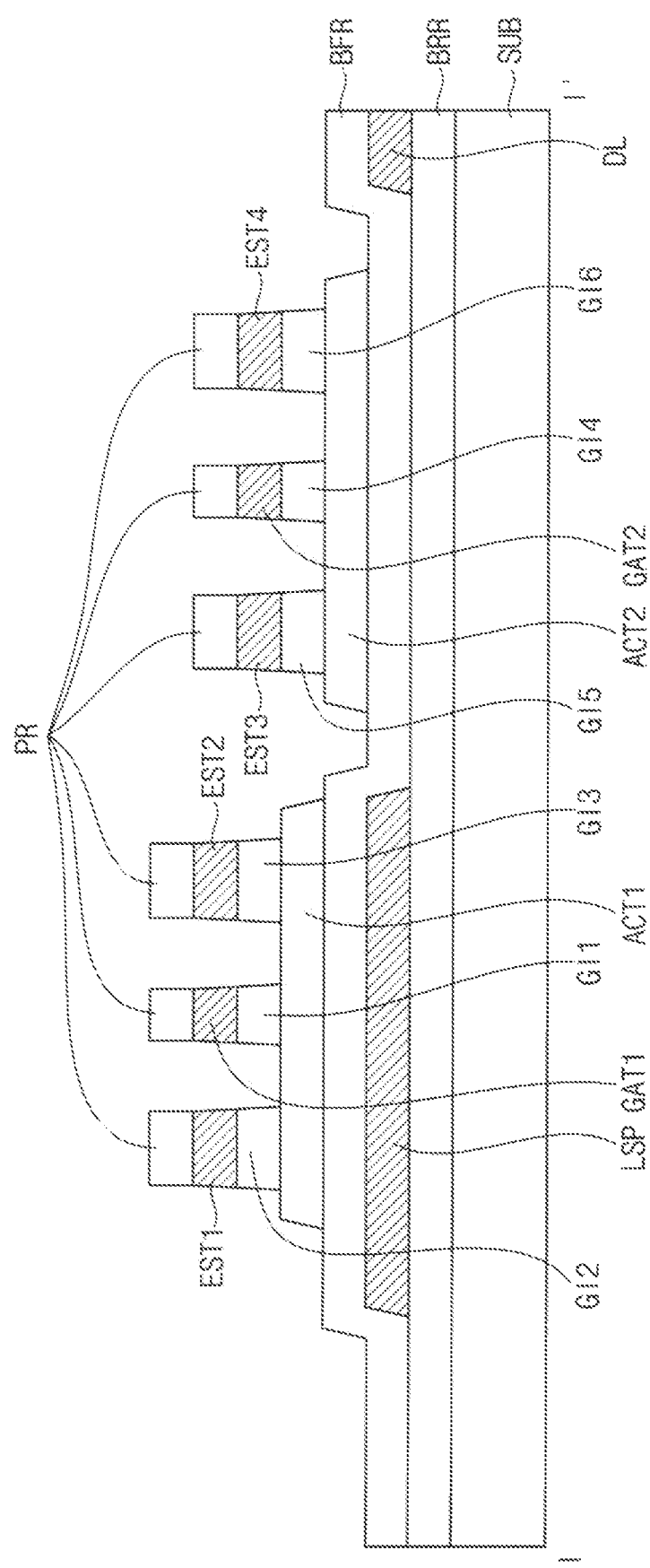

Referring to FIG. 9, the first to sixth insulating patterns GI1, GI2, GI3, GI4, GI5, and GI6 may be formed. In more detail, the first insulating pattern GI1 overlapping with the first gate electrode GAT1 may be formed by using the first gate electrode GAT1 as a mask. The second insulating pattern GI2 overlapping with the first etch stopper EST1 may be formed using the first etch stopper EST1 as a mask. The third to sixth insulating patterns GI3, GI4, GI5, and GI6 may also be formed through the same or substantially the same method (e.g., by using the second etch stopper EST2, the second gate electrode GAT2, the third etch stopper EST3, and the fourth etch stopper EST4 as masks, respectively). Thereafter, the photoresist patterns PR may be removed.

Figure 10:
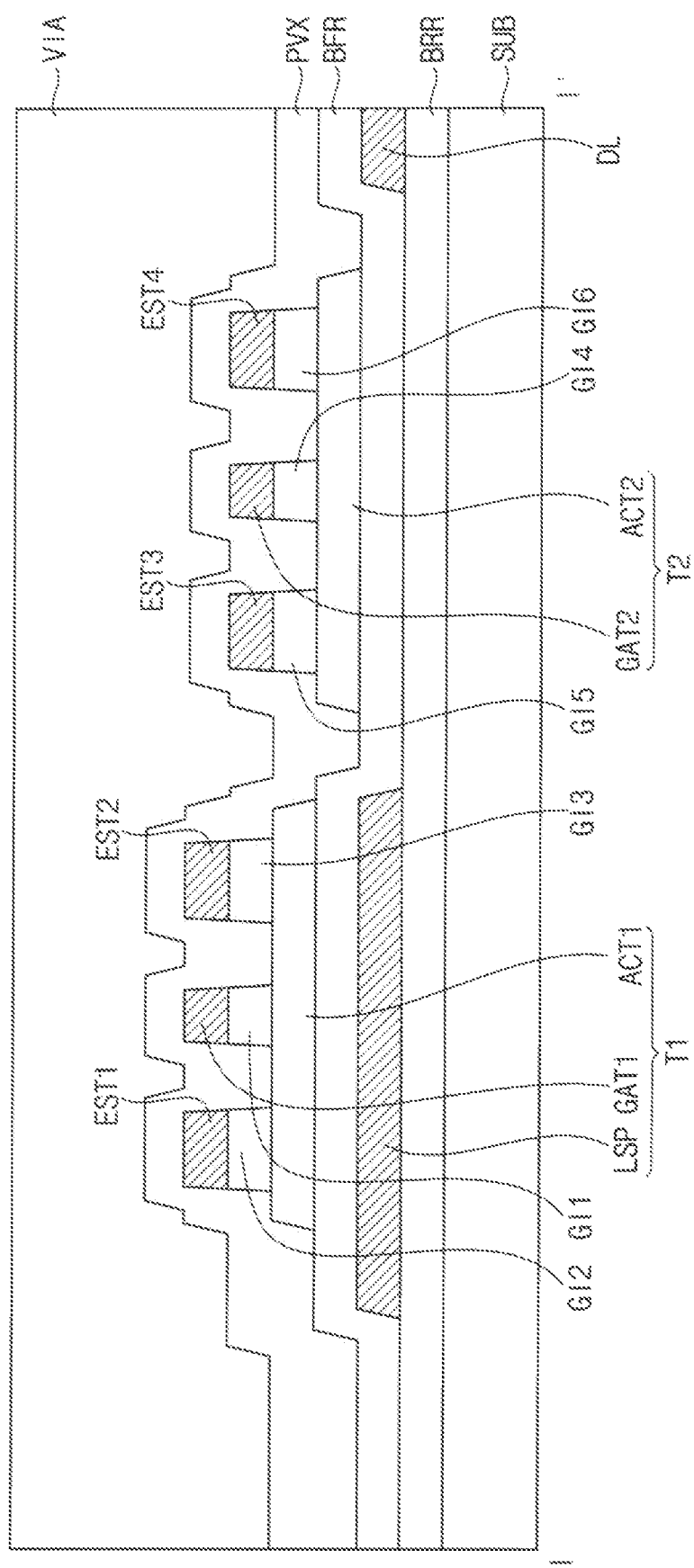

Referring to FIG. 10, an insulating layer may be formed. For example, the insulating layer may include the intermediate layer PVX, and the via insulating layer VIA. The intermediate layer PVX may cover the exposed first active pattern ACT1 and the exposed second active pattern ACT2. In addition, the intermediate layer PVX may include an inorganic material. For example, the intermediate layer PVX may include silicon oxide, silicon nitride, silicon oxynitride, tantalum oxide, tantalum nitride, or the like. In addition, the via insulating layer VIA may include an organic material. For example, the via insulating layer VIA may include a photoresist, a polyacrylic resin, a polyimide resin, an acrylic resin, or the like.

Figure 11:
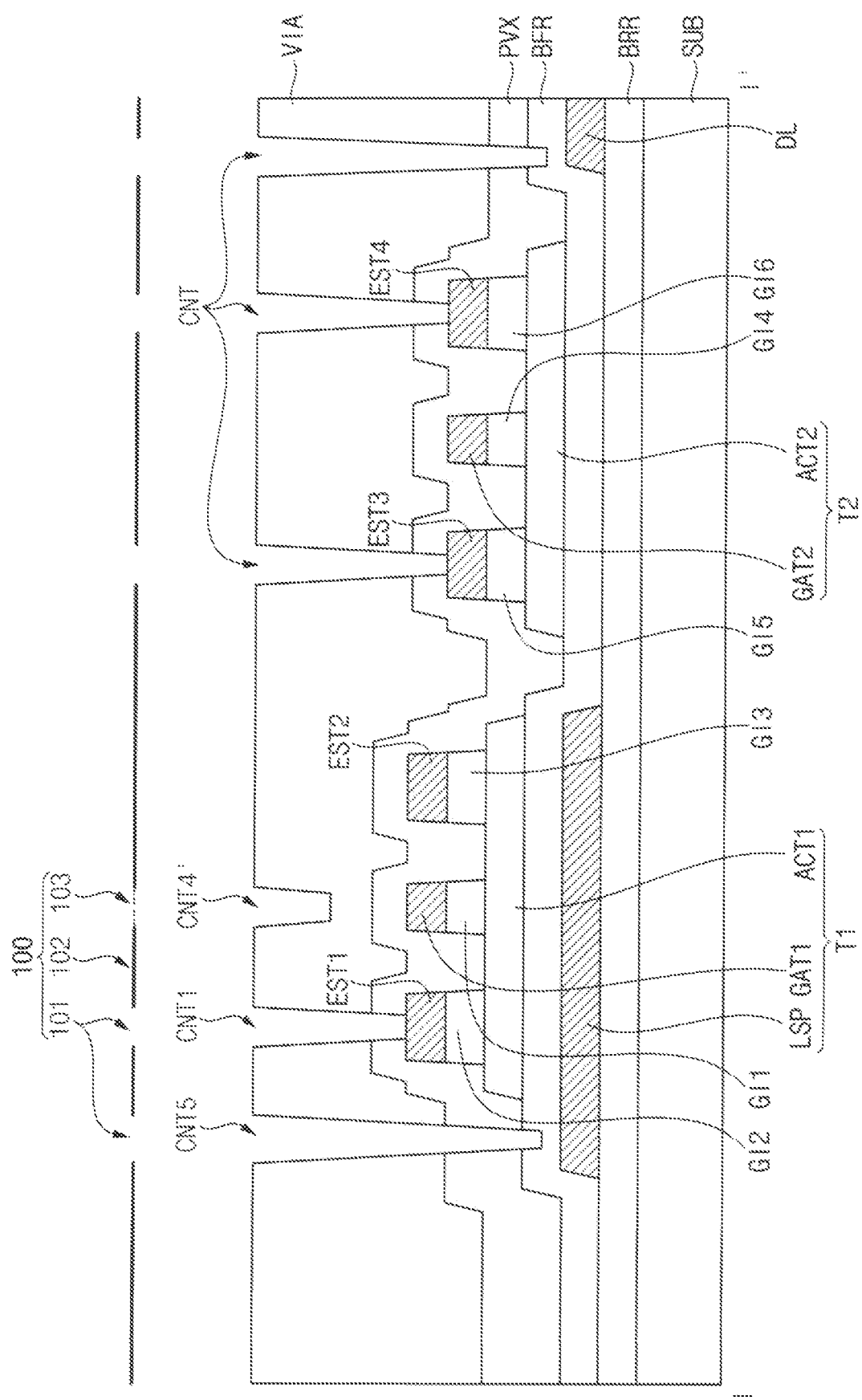

Referring to FIG. 11, a first contact hole CNT1, a preliminary fourth contact hole CNT4', a fifth contact hole CNT5, and a plurality of contact holes CNT may be formed.

The first contact hole CNT1 may penetrate the via insulating layer VIA and the intermediate layer PVX, and may expose the first etch stopper EST1.

The preliminary fourth contact hole CNT4' may penetrate the via insulating layer VIA, and may overlap with the first gate electrode GAT1. The preliminary fourth contact hole CNT4' may not expose the first gate electrode GAT1.

The fifth contact hole CNT5 may penetrate through the via insulating layer VIA, the intermediate layer PVX, and the buffer layer BFR, and may overlap with the first active pattern ACT1. The fifth contact hole CNT5 may not expose the light blocking pattern LSP.

The contact holes CNT may be formed in the same or substantially the same method as those of the first contact hole CNT1 and the fifth contact hole CNT5.

In an embodiment, the first contact hole CNT1, the preliminary fourth contact hole CNT4', the fifth contact hole CNT5, and the contact holes CNT may be formed through a first etching process. For example, the first etching process may be a dry etching process for removing inorganic materials.

In an embodiment, a depth of the preliminary fourth contact hole CNT4' may be smaller than a depth of the fifth contact hole CNT5. For example, the first etching process may be performed using a halftone mask 100. The halftone mask 100 may include a transmissive region 101, a blocking region 102, and a transflective region 103. The transmission region 101 may transmit light (e.g., ultraviolet rays for removing the inorganic material), and the blocking region 102 may block light. The transflective region 103 may transmit a relatively smaller amount of light than that of the transmissive region 101, and may transmit a relatively larger amount of light than that of the blocking region 102.

The halftone mask 100 may be disposed so that the transmissive region 101 overlaps with the first contact hole CNT1, the fifth contact hole CNT5, and the contact holes CNT. In addition, the halftone mask 100 may be disposed so that the transflective region 103 overlaps with the preliminary fourth contact hole CNT4'. Accordingly, while the fifth contact hole CNT5 penetrates the via insulating layer VIA, the intermediate layer PVX, and the buffer layer BFR, the preliminary fourth contact hole CNT4' may penetrate the via insulating layer VIA.

Figure 12:
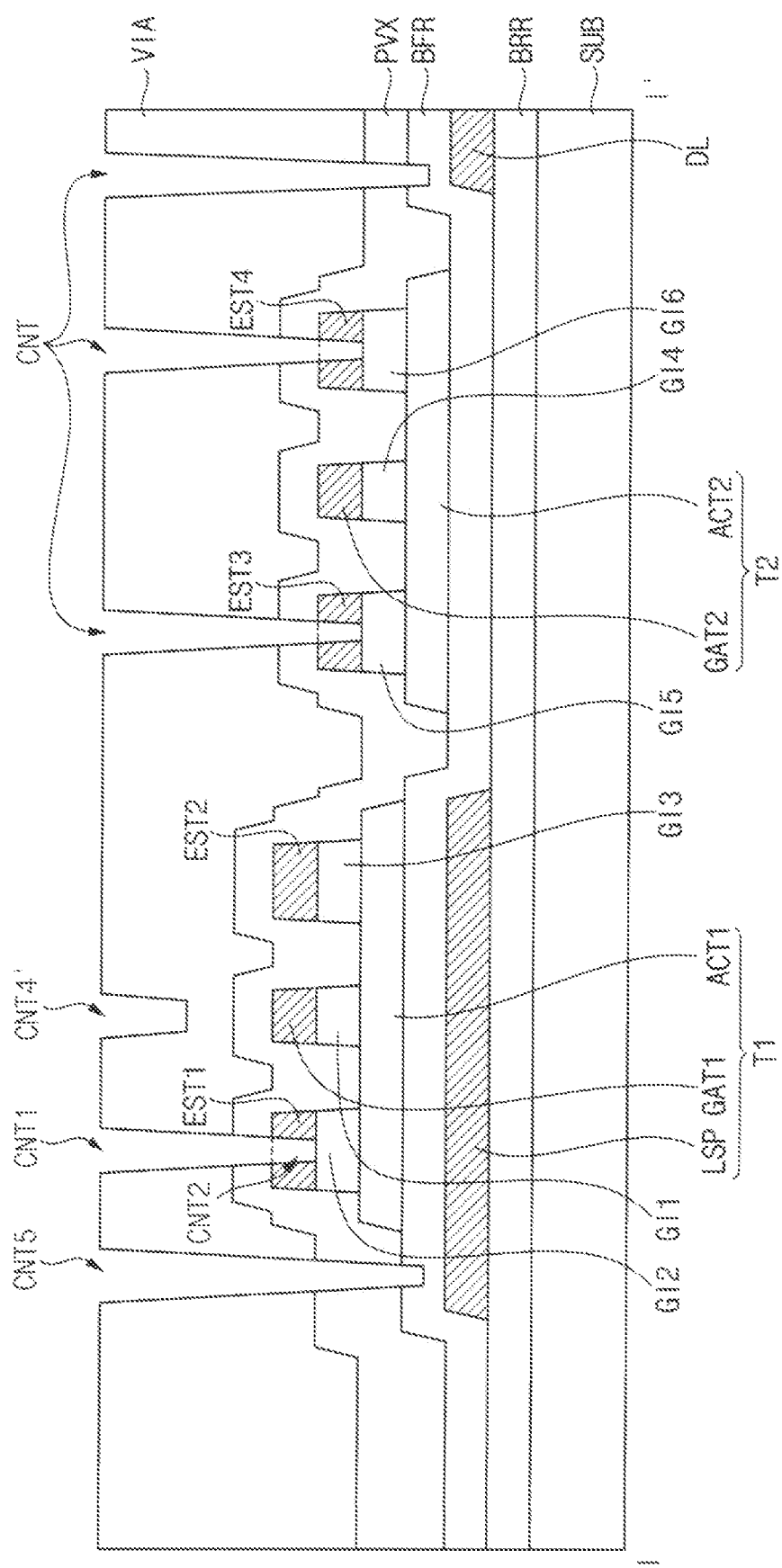

Referring to FIG. 12, a second contact hole CNT2 may be formed. The second contact hole CNT2 may penetrate the first etch stopper EST1, and may expose the second insulating pattern GI2.

In an embodiment, the second contact hole CNT2 may be formed through a second etching process. In an embodiment, the second etching process may be a dry etching process for removing a metal. In another embodiment, the second etching process may be a wet etching process for removing a metal. For example, the second etching process may be performed using an etching material having a high etching selectivity between the metal and the inorganic materials. Accordingly, while the second contact hole CNT2 is formed, a depth of the preliminary fourth contact hole CNT4' and a depth of the fifth contact hole CNT5 may be (e.g., may remain) constant or substantially constant.

Figure 13:
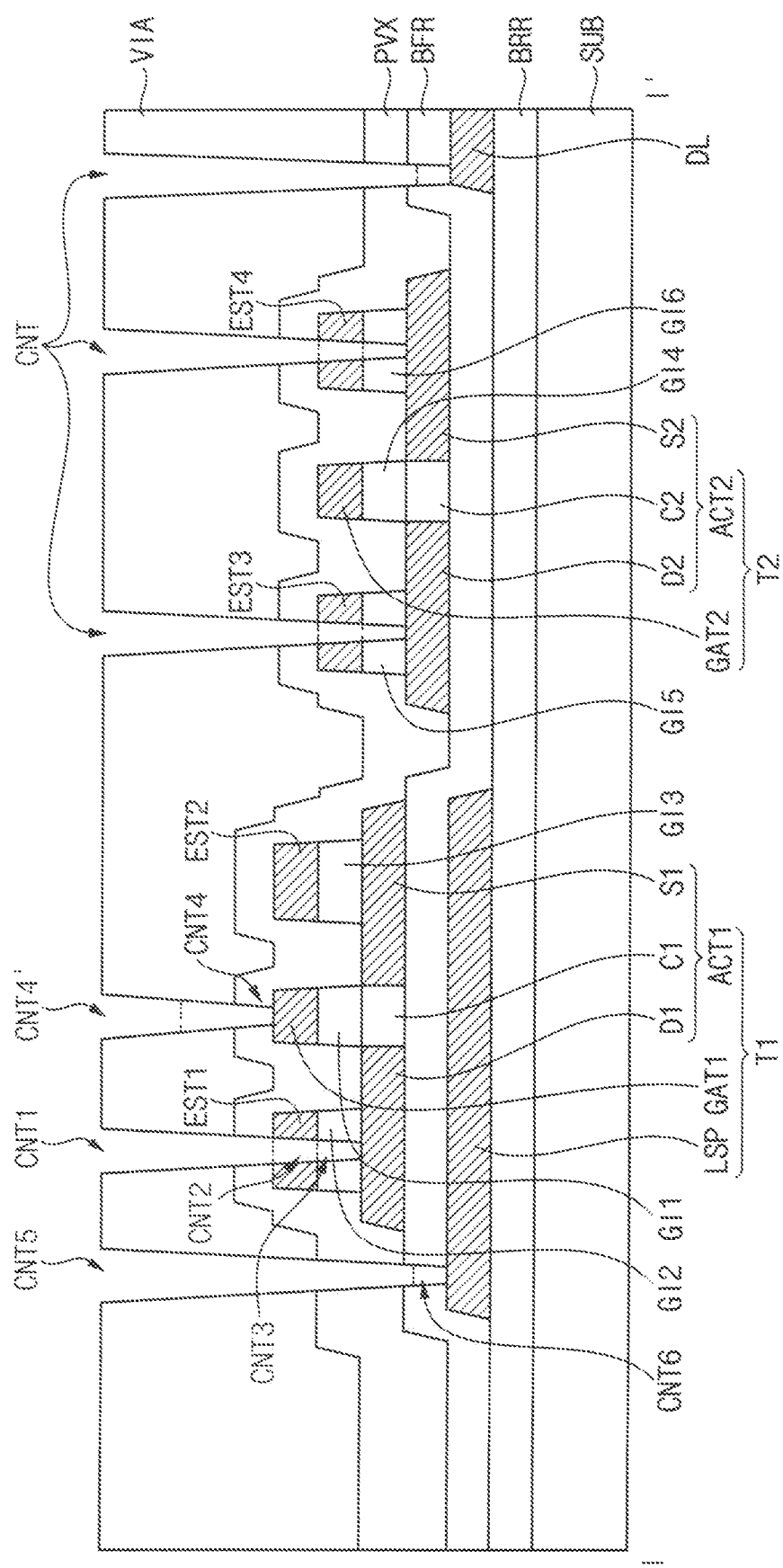

Referring to FIG. 13, a third contact hole CNT3, a fourth contact hole CNT4, and a sixth contact hole CNT6 may be formed. The third contact hole CNT3 may penetrate the second insulating pattern GI2, may be connected to the second contact hole CNT2, and may expose the first active pattern ACT1. The fourth contact hole CNT4 may penetrate the intermediate layer PVX, may be connected to the preliminary fourth contact hole CNT4', and may expose the first gate electrode GAT1. The sixth contact hole CNT6 may penetrate the buffer layer BFR, may be connected to the fifth contact hole CNT5, and may expose the light blocking pattern LSP.

In an embodiment, the third contact hole CNT3, the fourth contact hole CNT4, and the sixth contact hole CNT6 may be formed through a third etching process. For example, the third etching process may be a dry etching process for removing inorganic materials.

In the method of manufacturing the display device according to the present embodiment, while the first to third contact holes CNT1, CNT2, and CNT3 are formed, the fifth and sixth contact holes CNT5 and CNT6 may be formed. In more detail, the third contact hole CNT3 and the sixth contact hole CNT6 may be formed together. Accordingly, while the fifth and sixth contact holes CNT5 and CNT6 are formed, the first active pattern ACT1 may not be lost.

A comparative display device does not include the first etch stopper EST1. As a result, while exposing the light blocking pattern LSP and the first active pattern ACT1, which are disposed at (e.g., in or on) different layers from each other, the first active pattern ACT1 may be lost.

On the other hand, the display device according to the present embodiment may include the first etch stopper EST1 and the second insulating pattern GI2. The first etch stopper EST1 may include a metal, and the intermediate layer PVX and the buffer layer BFR may include an inorganic material. Accordingly, while the fifth contact hole CNT5 is formed, the first etch stopper EST1 may not be etched. Therefore, while the contact holes exposing the light blocking pattern LSP and the first active pattern ACT1, which are formed at (e.g., in or on) different layers from each other, are formed, the first active pattern ACT1 may not be lost.

Figure 14:
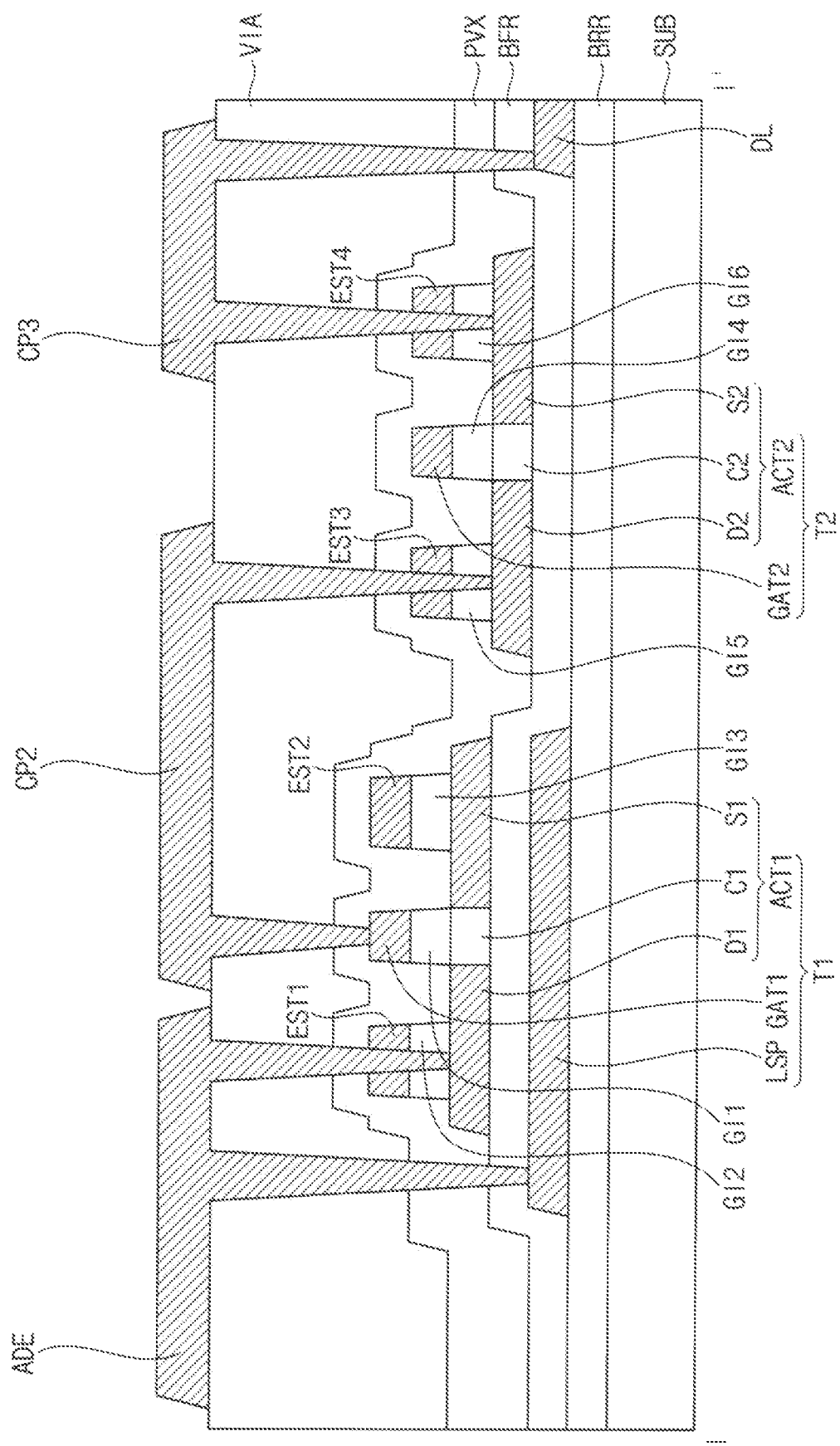

Referring to FIG. 14, the first electrode ADE, the first connection pattern CP1 (e.g., see FIG. 4), the second connection pattern CP2, and the third connection pattern CP3 may be formed on the via insulating layer VIA.

Figure 15:
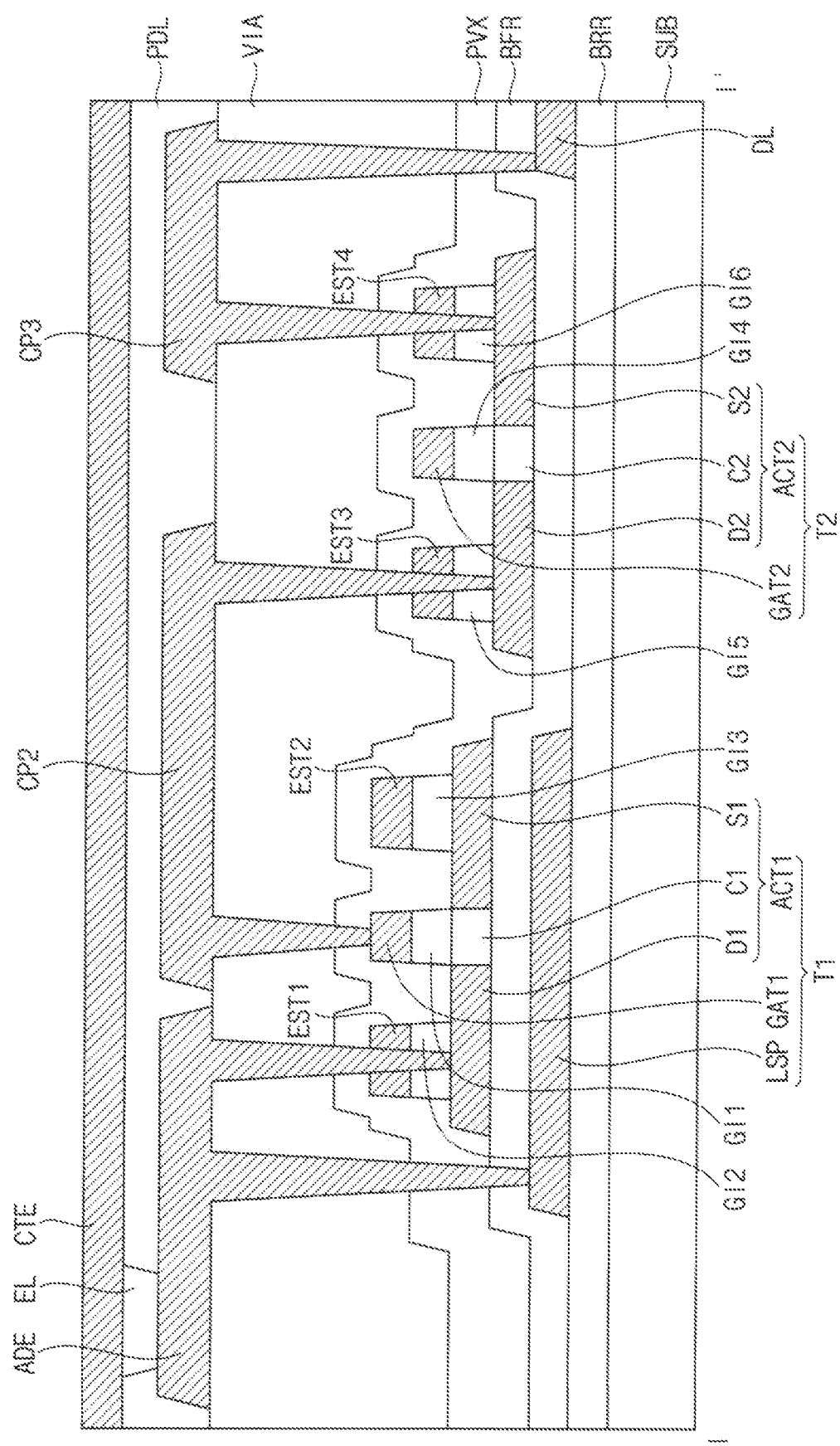

Referring to FIG. 15, the pixel defining layer PDL exposing the first electrode ADE may be formed on the via insulating layer VIA. The emission layer EL may be formed on the first electrode ADE, and the second electrode CTE may be formed on the emission layer EL.

The display device according to one or more embodiments of the present disclosure may include a conductive pattern (e.g., the light blocking pattern, the data line, and/or the like), the active pattern disposed on the conductive pattern, the insulating pattern disposed on the active pattern, and the etch stopper disposed on the insulating pattern. While the insulating layer that covers the conductive pattern is etched, the etch stopper may not be etched. Accordingly, while the conductive patterns that are connected to different layers and the contact holes exposing the active patterns are formed, the active pattern may not be lost.

In addition, in the method of manufacturing the display device, an additional connection pattern (e.g., a source electrode and/or a drain electrode) may not be formed between the intermediate layer and the via insulating layer. Accordingly, a mask for forming the additional connection pattern may not be used (e.g., may not be needed or may be omitted).

Although some example embodiments have been described, those skilled in the art will readily appreciate that various modifications are possible in the example embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific example embodiments disclosed herein, and that various modifications to the disclosed example embodiments, as well as other example embodiments, are intended to be included within the spirit and scope of the present disclosure as defined in the appended claims, and their equivalents.

What is claimed is:

1. A method of manufacturing a display device, comprising:
   forming a light blocking pattern on a substrate;
   forming an active pattern on the light blocking pattern;
   forming a preliminary gate insulating layer covering the active pattern on the substrate;
   forming a preliminary gate metal layer on the preliminary gate insulating layer;
   patterning the preliminary gate metal layer to concurrently form a gate electrode and an etch stopper;
   patterning the preliminary gate insulating layer to concurrently form a first insulating pattern and a second insulating pattern;
   forming an insulating layer covering the gate electrode and the etch stopper on the substrate;
   forming a first contact hole penetrating the insulating layer, and exposing the etch stopper;
   forming a second contact hole penetrating the etch stopper, and being connected to the first contact hole;
   forming a third contact hole and a fourth contact hole concurrently, the third contact hole exposing the active pattern and being connected to the second contact hole, and the fourth contact hole exposing the gate electrode; and
   forming a first electrode on the insulating layer, the first electrode contacting the active pattern through the first contact hole, the second contact hole, and the third contact hole.

2. The method of claim 1, wherein the forming of the first contact hole comprises forming a fifth contact hole overlapping with the light blocking pattern, and
   wherein the fifth contact hole does not expose the light blocking pattern.

3. The method of claim 2, wherein the forming of the third contact hole and the fourth contact hole comprises forming a sixth contact hole connected to the fifth contact hole, and
   wherein the sixth contact hole exposes the light blocking pattern.

4. The method of claim 3, wherein the first electrode further contacts the light blocking pattern through the fifth and sixth contact holes.

5. The method of claim 1, wherein the insulating layer covers the gate electrode while the second contact hole is formed.

6. The method of claim 1, wherein the first insulating pattern overlaps with the gate electrode, and
   wherein the second insulating pattern overlaps with the etch stopper.

7. The method of claim 1, wherein the second insulating pattern comprises an insulating material, and
   wherein the etch stopper comprises a metal.

8. The method of claim 1, further comprising:
   forming an emission layer on the first electrode; and
   forming a second electrode on the emission layer after the first electrode is formed.

* * * * *